United States Patent [19]

Deem et al.

[11] Patent Number: 4,715,001
[45] Date of Patent: Dec. 22, 1987

[54] EXTREMELY ACCURATE AUTOMATIC FREQUENCY CONTROL CIRCUIT AND METHOD THEREFOR

[75] Inventors: Jake O. Deem; Ronald W. Kassik, both of Scottsdale; N. Bruce Metteer, Phoenix, all of Ariz.

[73] Assignee: Motorola, Inc., Schaumburg, Ill.

[21] Appl. No.: 643,507

[22] Filed: Aug. 23, 1984

[51] Int. Cl.⁴ .................. H04B 1/26; H03L 7/08; G05B 15/02
[52] U.S. Cl. .................. 364/484; 331/18; 358/195.1; 455/164; 455/182; 455/265
[58] Field of Search .................. 364/484, 728; 375/97, 375/120; 455/164, 182–184, 186, 255, 257, 259, 260, 265; 331/1 A, 17, 18; 358/195.1

[56] References Cited

U.S. PATENT DOCUMENTS

| | | | |
|---|---|---|---|
| 3,454,710 | 7/1969 | Gassmann | 455/257 |
| 3,686,574 | 8/1972 | Niman | 455/259 |
| 4,367,558 | 1/1983 | Gercekci et al. | 455/164 |
| 4,384,365 | 5/1983 | Malinowski et al. | 455/260 |
| 4,408,349 | 10/1983 | Yukawa | 455/182 |
| 4,418,318 | 11/1983 | Swagerty et al. | 331/1 A |
| 4,513,448 | 4/1985 | Maher | 455/265 |
| 4,542,533 | 9/1985 | Parker | 455/183 |
| 4,580,107 | 4/1986 | Caldwell et al. | 331/17 |

Primary Examiner—Felix D. Gruber
Attorney, Agent, or Firm—Lowell W. Gresham

[57] ABSTRACT

An automatic frequency control circuit having the ability to resolve the frequency of an incoming signal to an extreme level of accuracy and to tolerate amplitude and pulse modulation on the incoming signal is disclosed. Two negative feedback loops are utilized. A coarse adjustment feedback loop resolves the frequency of the incoming signal to within the authority of a fine adjustment feedback loop. A computer is a common element of both loops and makes decisions regarding whether to resolve incoming a signal frequency using the coarse or the fine adjustment loops. Phase differences between a signal derived from the incoming signal and a reference signal are sampled at controllable time intervals apart to determine frequency adjustments within the fine adjustment loop.

19 Claims, 7 Drawing Figures

EXTREMELY ACCURATE AUTOMATIC FREQUENCY CONTROL CIRCUIT AND METHOD THEREFOR

BACKGROUND OF THE INVENTION

The present invention relates generally to automatic frequency control circuits, frequency detection circuits, and the like. Specifically, the present invention relates to an extremely accurate frequency resolution circuit that achieves a locked condition within a short time interval. More specifically, the present invention relates to a frequency resolution circuit which tolerates both amplitude and pulse modulation of the signal whose frequency it resolves.

A great many electronic applications encode information into an AC signal in order to transmit the information. Many forms of encoding are known, such as amplitude modulation, frequency modulation, and pulse modulation. In order to recover the encoded information, a device which receives the AC signal must decode the information from the AC signal.

The present invention decodes frequency modulation information of such signals by providing solutions to three problems. First, the present invention achieves an extremely accurate resolution of the frequency of the encoded signal. For example, the present invention has demonstrated a frequency resolution accuracy of 1 part in 100,000,000. Second, the present invention achieves this frequency resolution in a reasonably fast time interval. For example, a locking time of 0.01 second has been demonstrated by the present invention. And third, the present invention achieves the frequency resolution regardless of whether the encoded signal is further modulated with pulse and amplitude information.

Phase locked loop circuits are well known in the art and have been used in various frequency control and frequency resolution circuits. However, such circuits fail to achieve the performance of the present invention.

Accordingly, it is one object of the present invention to provide an apparatus which resolves the frequency of an incoming signal to an extreme level of accuracy.

Another object of the present invention concerns providing an apparatus that achieves a locked condition in a relatively short time interval. The locked condition occurs when the unknown frequency of the input signal is resolved within some predetermined level of accuracy.

Still another object of the present invention relates to having frequency resolution circuitry which demonstrates a high level of performance even in the presence of signals which may be both amplitude and pulse modulated in addition to being frequency modulated.

Yet another object of the present invention relates to providing a reasonably stable, noise tolerant system.

SUMMARY OF THE INVENTION

The above and other objects are achieved by an automatic frequency control circuit which receives an input signal exhibiting an unknown frequency and resolves the frequency of the signal. The signal is input to a mixer and combined with a signal from a variable frequency oscillator. The output of the mixer couples to a phase detector which outputs a signal representing the instantaneous phase difference between the mixer's output signal and a signal from a fixed frequency oscillator. The phase detector output coupled to a computer, and the computer has an output which couples back to the variable frequency oscillator. The computer, under the influence of a predetermined program, controls the oscillation frequency of the variable frequency oscillator in response to the signal received from the phase detector.

DETAILED DESCRIPTION OF THE INVENTION

Figure 1:
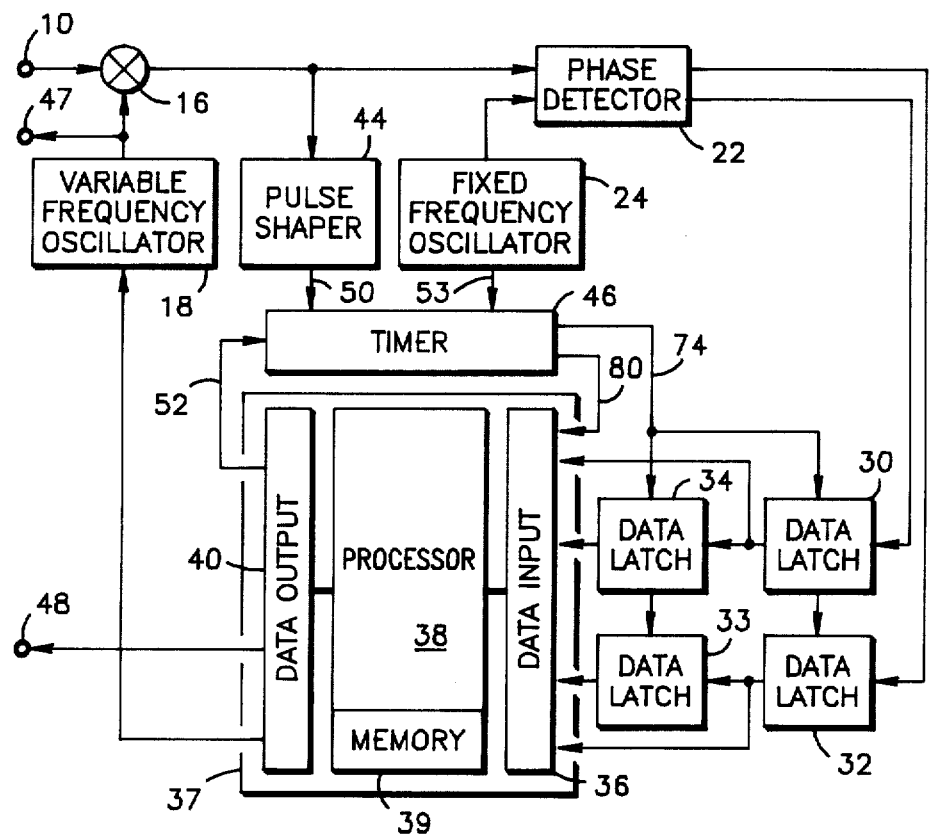
FIG. 1 shows a simplified block diagram of one embodiment of the present invention.

FIG. 1 shows a simplified block diagrammatic representation of one embodiment of the present invention. In this embodiment an input signal exhibiting an unknown frequency is applied at a terminal 10 to a mixer 16. A local oscillator signal which oscillates at an adjustable frequency also enters mixer 16 from a variable frequency oscillator 18. Mixer 16 outputs an intermediate signal which represents the difference in frequency between the input signal and the local oscillator signal.

A phase detector 22 receives the intermediate signal from mixer 16 and a reference signal from a fixed frequency oscillator 24. In this particular embodiment of the present invention, phase detector 22 represents a type of phase detector known to those skilled in the art as a quadrature phase detector. Quadrature phase detectors output two signals whose voltages are orthogonal, or separated in phase by 90 degrees. These two signals suggest a phase relationship between the two input signals.

Figure 2:
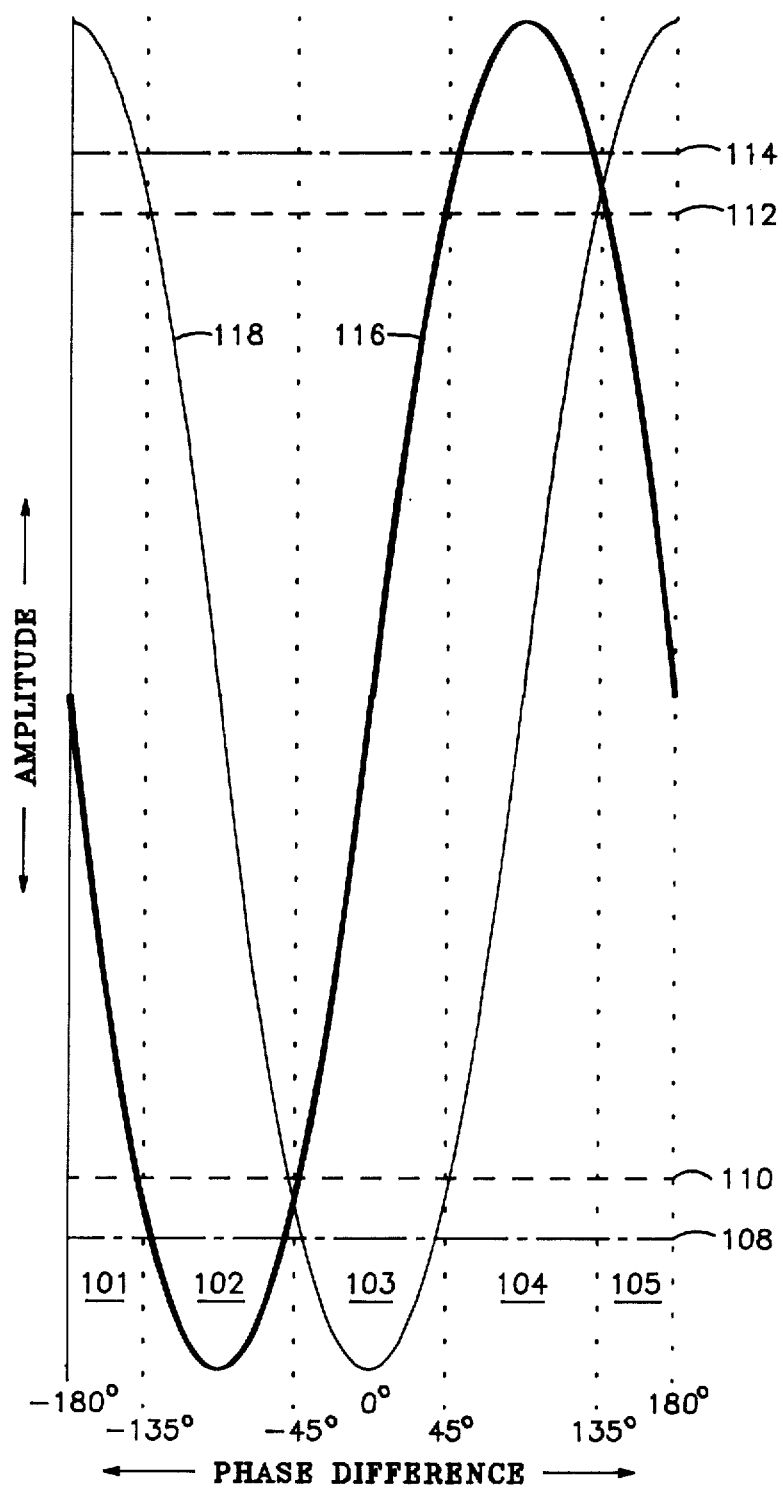
FIG. 2 shows the relationship between the input and output signals of one embodiment of a phase detector portion of the present invention.

A SIN phase signal 116 and a COS phase signal 118 represent the two orthogonal signals, as shown in FIG. 2. The amplitude of phase signals 116 and 118 describes an instantaneous phase difference between the intermediate signal and the reference signal. When the frequency of the intermediate signal equals the frequency of the reference signal, phase signals 116 and 118 are DC voltage levels, or signals which do not change in time. However, if the frequency of the intermediate signal does not equal the frequency of the reference signal the phase signals 116 and 118 do change in time. Furthermore, the greater the difference between the frequency of the intermediate signal and the reference signal, the faster the change in time of phase signals 116 and 118.

Data latches 30 and 32 (see FIG. 1) receive phase signals 116 and 118, respectively, from phase detector 22 and thus collectively operate as a phase data latch. In this particular embodiment, the outputs of data latches 30 and 32 each connect to both a data input 36 of a computer 37 and inputs of data latches 34 and 33, respectively. The output of data latches 33 and 34 also connected to data input 36 of computer 37. A phase data strobe output 74 from a timer 46 connects to a control input of each of data latches 30, 32, 33, and 34.

A first time strobe 74 becomes active, data latches 30 and 32 save a first instantaneous phase difference ($\phi$1) represented by phase signals 116 and 118, respectively. A second time proble 74 becomes active, the first instantaneous phase difference ($\phi$1) transfers from data latches 30 and 32 to data latches 34 and 33, respectively, and a second instantaneous phase difference ($\phi$2) represented by phase signals 116 and 118 is saved in data latches 30 and 32. After the second time strobe 74 becomes active, information presented to data input 36 from data latches 33 and 34 describes the first instantaneous phase difference ($\phi$1), and information presented to data input 36 from data latches 30 and 32 describes a second instantaneous phase difference ($\phi$2) where the time interval between the first and second phase differences is described by the interval of time between the first and second time strobe 74 becomes active.

Data input 36 supplies data to a processor 38 which executes a predetermined computer program contained in a memory 39. Processor 38 produces data at a data output 40, and a portion of this data is routed to variable frequency oscillator 18. Thus, a feedback loop is formed among mixer 16, phase detector 22, data latches 30, 32, 33, 34, computer 37, and variable frequency oscillator 18. Outputs of the present invention may be generated at a terminal 48 which connects to data output 40 or at a terminal 47 which connects to the output of oscillator 18.

In this particular embodiment timer 46 also receives data from data output 40 through a data bus 52, and inputs data to data input 36 through an output bus 80. Timer 46 receives other inputs from fixed frequency oscillator 24 at a terminal 53 and a pulse shaper 44 at a terminal 50. Pulse shaper 44 in turn receives an input signal from the output of mixer 16.

Processor 38, under the influence of the computer program, calculates appropriate control values which are output through data output 40 and which tend to vary the oscillation frequency of variable frequency oscillator 18. A negative feedback loop is established causing processor 38 to repetitively calculate control values for variable frequency oscillator 18 until oscillator 18 causes the frequency of the intermediate signal output from mixer 16 to match the frequency of fixed oscillator 24. Thus, the present invention represents an automatic frequency control loop rather than a phase locked loop because the present invention does not try to force this intermediate signal to seek a DC level.

As processor 38 causes the frequency of the intermediate signal output from mixer 16 to equal the frequency of the reference signal from fixed frequency oscillator 24, the output from phase detector 22 approaches a DC level. In other words, the phase difference between the intermediate signal and the reference signal tends to exhibit a smaller change ($\Delta\phi$) over a given time interval ($\Delta$t). Accordingly, an instantaneous frequency (Fi) decreases as the change in phase difference decreases, as shown by equation (1).

$$Fi = \Delta\phi/2\pi(\Delta t) \tag{1}$$

Processor 38 computes the calculation of equation (1). In order for processor 38 to accurately calculate that instantaneous frequency (Fi) equals zero, phase difference change ($\Delta\phi$) must accurately reflect zero. However, the values for the phase difference ($\phi$) presented to processor 38 do not precisely reflect true phase differences due to quantization errors and noise. For example, the phase difference ($\phi$) may be accurate only to ±2 degrees so that the phase difference change ($\Delta\phi$) over a given time interval ($\Delta$t) would be accurate only to ±4 degrees. Processor 38, under the influence of the computer program, nevertheless improves accuracy in the instantaneous frequency (Fi) calculation by using a controllable time interval ($\Delta$t). Accuracy of Fi improves from increasing the time interval ($\Delta$t) over which the phase difference change ($\Delta\phi$) is sampled. Accordingly, the accuracy of the present invention improves by controlling both the accuracy of the phase difference ($\phi$) measurements and by increasing the controllable time interval ($\Delta$t).

The time interval ($\Delta$t) cannot be increased indiscriminately because ambiguities can arise in the associated phase difference change ($\Delta\phi$). For example, phase difference changes of +120 degrees, −240 degrees, +480 degrees, −600 degrees, etc. in a given time interval ($\Delta$t) are indistinguishable from one another. One way to resolve this ambiguity is to require the incoming signal at terminal 10 to exhibit a frequency within a narrow range of frequencies so that the intermediate signal output from mixer 16 will be close in frequency to the reference signal output from mixed frequency oscillator 24. If the two frequencies are close together, then only a relatively small amount of phase difference change ($\Delta\phi$) can be expected in a given time interval ($\Delta$t). Another way to resolve the ambiguity is to allow the time interval ($\Delta$t) to be very short. Accordingly, the shorter the time interval ($\Delta$t), the less phase difference change ($\Delta\phi$) that can occur and the greater the frequency difference between reference and intermediate signals that can be tolerated before an ambiguity occurs.

The present invention resolves the above mentioned phase abmiguities, and allows for an accurate determination of the incoming frequency over a relatively broad range of frequencies by insuring relatively high accuracy of the incoming phase difference ($\Delta\phi$) information, by decreasing the time interval ($\Delta$t) between phase difference samples when ambiguities could occur, and by increasing the time interval ($\Delta$t) when the potential for ambiguities permits.

Figure 3:
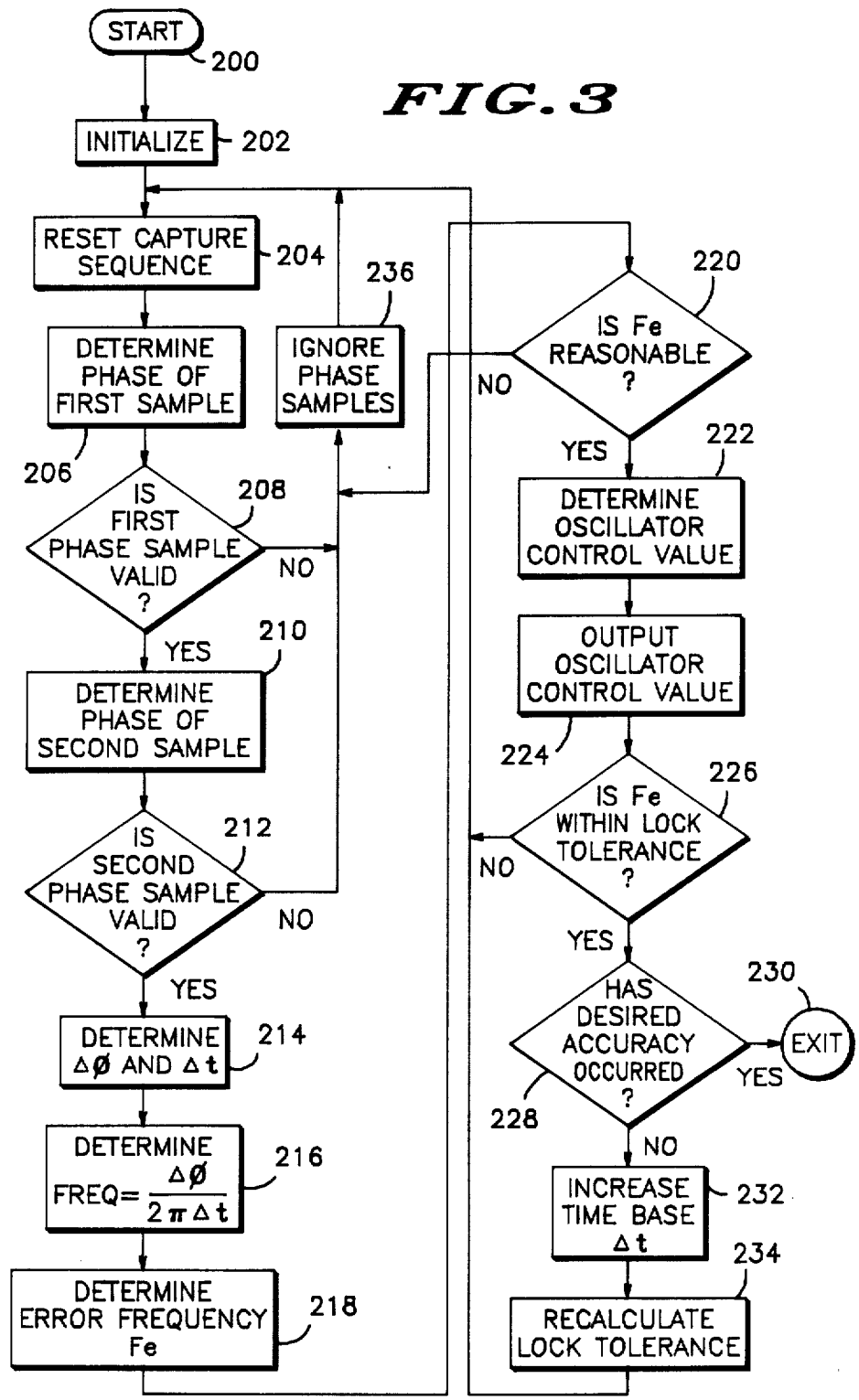
FIG. 3 shows a flow chart of the algorithm followed by a processor portion of the present invention.

The computer program executed by processor 38 provides the basic control for the timing and accuracy, as shown in the flow charts illustrated in FIG. 3. Processor 38 begins execution of the computer program relevant to the present invention at a step 200. A step 202 calls for a general initialization that needs to be performed only once for the sequence which follows. Such initialization may include outputtting a value at data output 40 which sets variable frequency oscillator 18 to a nominal value. Initialization 202 may also include outputting a value at data output 40 which causes timer 46 to minimize the controllable time interval ($\Delta$t) between phase difference samples. Minimizing the time interval ($\Delta$t) allows the greatest difference in frequency between the incoming signal at terminal 10 and the local oscillator signal from variable frequency oscillator 18 before a phase ambiguity occurs in the phase difference samples.

A step 204, executed after step 202, resets a capture sequence which follows. This step performs the type of initialization which is repeated during the locking process. It may include initializing information about the stability of the phase difference information being received at data input 36, or other memory 39 locations which are used to store a priori characterization of the incoming signal.

The capture sequence causes the instantaneous frequency (Fi) calculated at a given time interval (Δt) to achieve a frequency which is within a predetermiend lock tolerance of a signal having a frequency of zero. Once the capture sequence is completed, the time interval is increased, and then the capture sequence is repeated until a desired overall accuracy is achieved.

A step 206 determines the phase of the first phase difference ($\phi$1) sample. As described above, circuitry from phase detector 22, timer 46, and data latches 30, 32, 33, and 34 cooperate to present phase difference information at data input 36. Step 206 converts data at data input 36 into a phase value which is useful for later calculations.

Figure 4:
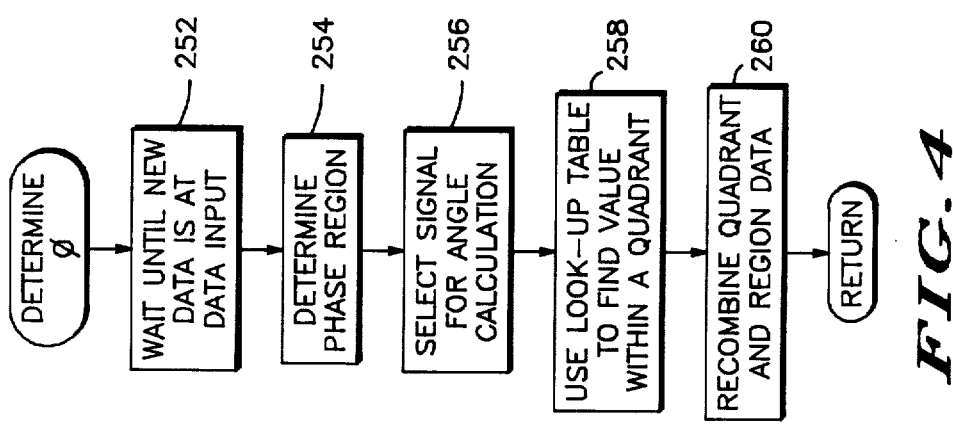
FIG. 4 expands the steps for determining first and second phase samples from the flow chart shown in FIG. 3.

As shown in FIG. 4, step 206 contains several sub-steps. A step 252 determines whether information presented at data input 36 represents new information which needs to be processed. When new phase difference information is present, a step 254 determines which region is represented by the phase difference sample.

As shown in FIG. 2, phase difference ($\phi$) may occur in any of regions 101, 102, 103, 104 or 105. Region 101 represents a phase difference from $-180$ to $-135$ degrees between the intermediate signal, which is output from mixer 16, and the reference signal, which is output from fixed frequency oscillator 24. Likewise, region 102 represents a phase difference from $-135$ to $-45$ degrees, region 103 represents a phase difference from $-45$ to $+45$ degrees, region 104 represents a phase difference from $+45$ to $+135$ degrees, and region 105 represents a phase difference from $+135$ to $+180$ degrees.

The processor distinguishes the regions from each other by comparing the amplitudes of SIN phase signal 116 and COS phase signal 118. The amplitude of signals 116 and 118 may be divided into five amplitude areas by comparing the signal with four reference amplitudes. A first amplitude area occurs where the signal is greater than a high voltage upper limit (HVU) 114. A second amplitude area occurs where a signal's amplitude is less than HVU 114 but is greater than a high voltage lower limit (HVL) 112. A third amplitude area occurs where a signal's amplitude is less than HVU 114 and HVL 112 but is greater than a low voltage upper limit (LVU) 110. A fourth amplitude area occurs where a signal's amplitude is less than HVU 114, HVL 112, and LVU 110 but greater than a low voltage lower limit (LVL) 108. And, a fifth amplitude area occurs where a signal's amplitude is less than HVU 114, HVL 112, LVU 110, and LVL 108. HVU 114 and HVL 112 as well as LVU 110 and LVL 108 are chosen to circumscribe the signal when it reflects a phase difference at the boundaries between regions 101, 102, 103, 104 and 105. Accordingly, the first and fifth regions 101 and 105 occur when COS phase signal 118 is greater than HVU 114, region 102 occurs when SIN phase signal 116 is less than LVL 108, region 103 occurs when COS phase 118 is less than LVL 108, and region 104 occurs when SIN phase 116 is greater than HVU 114.

After the region associated with the phase difference ($\phi$) has been determined, a step 256 selects either phase signal 116 or phase signal 118 for the angle calculation. The selection process chooses the signal whose amplitude is less than HVL 112 but greater than LVU 110.

This selection process improves the accuracy of the phase difference ($\phi$) calculation for two reasons. First, the phase error of a signal within this amplitude area is less than would be obtained from a signal in another area. Second, the error itself tends to remain more constant within this amplitude area than for other amplitude areas. The non-selected signal is ignored.

A step 258 then uses a look-up table in memory 39 to find a phase value within the region. A region only spans ±45 degrees, so the value obtained from the look-up table represents only a phase within a ±45 degree quadrant. Those skilled in the art will recognize that phase difference ($\phi$) could alternatively be calculated or approximated without the use of a look-up table in memory. Applications that do not require the extreme accuracy or the fast lock time achieved by the present embodiment may use these other phase difference determinations.

A step 260 combines the quadrant phase difference from step 258 with the region number determined in step 254 to produce the final phase value. Accordingly, this final phase value is the object of step 206 in the flow diagram shown in FIG. 3.

Referring to FIG. 3, a step 208 uses the final phase value from step 206 and examines it to determine if the value represents valid data. In the present embodiment invalid data is represented by phase angles on the boundaries between regions 101, 102, 103, 104, and 105. These boundaries occur at integral multiples of 45 degrees of phase difference. SIN and COS phase signals 116 and 118 having amplitude greater than VHL 112 but less than VHU 114 or greater than LVL 108 but less than LVU 110 also represent invalid phase data. The inaccuracies in determining the region number and the angle within a quadrant are too great in these situations to yield accurate and reliable results. Thus, if step 208 determines that the phase difference value from the first phase differene sample ($\phi$1) is not valid, then a step 236 ignores the first phase difference sample ($\phi$1) and reset capture sequence step 204 repeats.

However, if step 208 determines that a valid first phase difference sample ($\phi$1) was obtained, then a step 210 proceeds to determine the phase value from a second phase difference sample ($\phi$2). The sub-steps shown in FIG. 4 and described above are repeated to determine a phase value for the second phase difference sample ($\phi$2). A step 212 then examines the phase value results from step 210 in a similar manner to that used in step 208. A determination of an invalid sample causes processor 38 to execute step 236 which ignores the second phase difference sample ($\phi$2) and then to execute reset capture sequence step 204.

Processor 38 executes a step 214 if step 212 indicates that a valid second phase sample ($\phi$2) has been obtained. Step 214 determines the phase difference change ($\Delta\phi$) and time interval ($\Delta t$) mentioned above in connection with Equation 1. The phase difference change ($\Delta\phi$) is determined from the valid first and second phase samples generated in steps 208 and 212. Generally, substituting the first phase value obtained in step 208 from the second sample obtained in step 212 suffices. However, if the first phase difference ($\phi$1) was sampled in a region number higher than the second ($\phi$2), then the phase difference change ($\Delta\phi$) traversed the region-105-to-region-101 boundary and must be either accounted for or discarded. A positive phase change indicates that the phase is increasing in time, or that the frequency of the intermediate signal is less than the frequency of the reference signal. Similarly, a negative phase change ($\Delta\phi$) indicates that the frequency of the intermediate signal is greater than the frequency of the reference signal.

Figure 6:
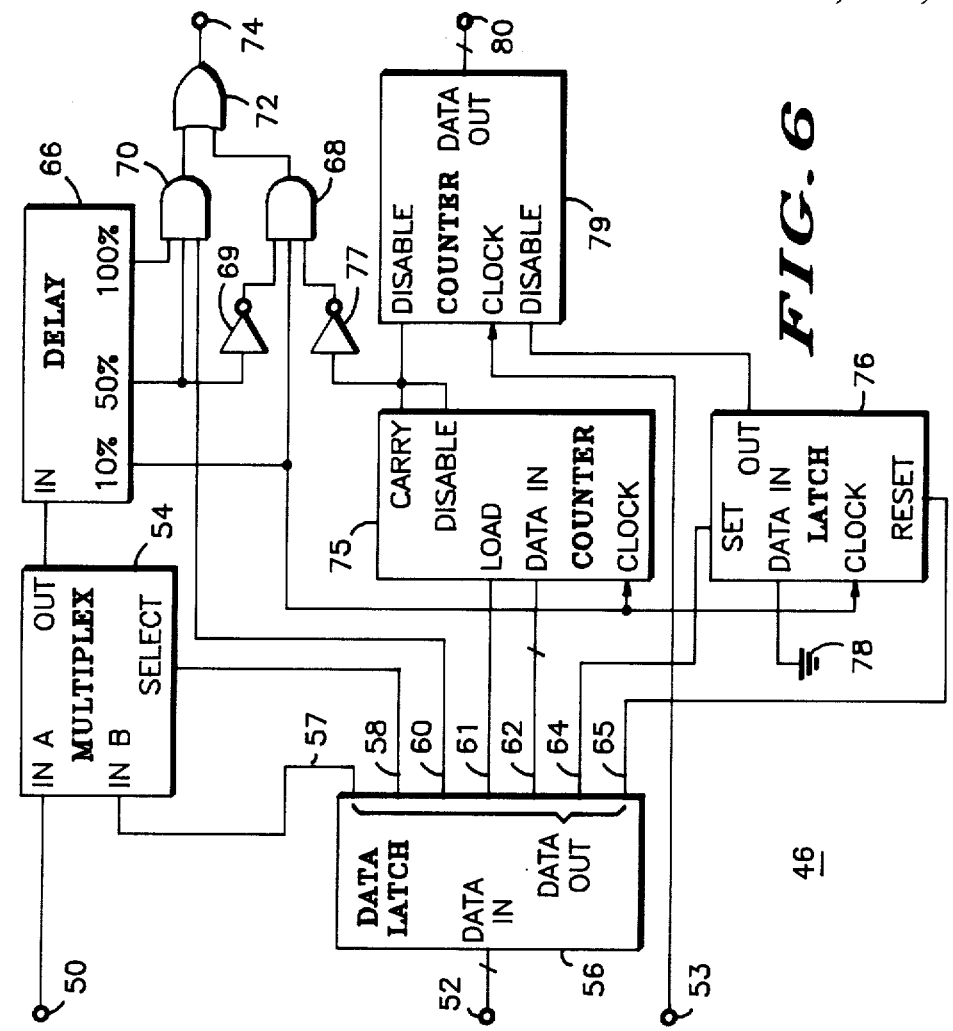
FIG. 6 shows one embodiment of a timing portion of the block diagram shown in FIG. 1.

The controllable time interval ($\Delta t$) information may come from several different sources depending on the configuration of timer 46, the types of signals received, and the frequencies being encountered. One embodiment of timer 46 of the present invention which may be used in a wide variety of applications is shown in FIG. 6. The FIG. 6 embodiment of timer 46 permits pulse modulation of the incoming signal at terminal 10 in addition to frequency modulation. It also permits resolution of a fairly large range of frequencies.

Inputs to timer 46 may be represented by a signal at a terminal 50 from pulse shaper 44 (see FIG. 1), a data bus 52 from data output 40, and a fixed frequency clock signal at a terminal 53 derived from fixed frequency oscillator 24. Data bus 52 enters a data latch 56 and permits processor 38, under influence of the computer program, to control the modes and timing intervals of timer 46.

A first output 57 from data latch 56 connects to a first signal input of a multiplexer 54. The pulse shaper signal from terminal 50 connects to a second signal input of multiplexer 54 and a second output 58 from data latch 56 connects to a select input of multiplexer 54. An output from multiplexer 54 connects to the input of a delay line 66. A 10% delay output from delay line 66 connects to a first input of a three-input AND gate 68 and to clock inputs of a counter 75 and a latch 76. A 50% delay output from delay line 66 connects to an input of inverter 69 and to a first input of a three-input AND gate 70. A 100% delay output from delay line 66 connects to a second input of three-input AND gate 70. A third output 60 from data latch 56 connects to a third input of three-input AND gate 70. An output of inverter 69 connects to a second input of three-input AND gate 68. An output of three-input AND gate 70 connects to a first input of a two-input OR gate 72 and an output of three-input AND gate 68 connects to a second input of two-input OR gate 72. An output of two-input OR gate 72 represents the phase data strobe 74 mentioned above and connects to the control input of data latches 30, 32, 34, and 33 (see FIG. 1).

A fourth output 61 from data latch 56 connects to a load input of counter 75, and a fifth bus output 62 from data latch 56 connects to a data input of counter 75. A carry output for counter 75 connects to a disable input of counter 75, to a disable input of a counter 79, and to an input of an inverter 77. An output of inverter 77 connects to a third input of three input AND gate 68. A sixth output 64 from data latch 56 connects to a set input of latch 76, and a seventh output 65 from data latch 56 connects to a reset input of latch 76. A ground 78, or other suitable logic level, connects to a data input of latch 76, and an output from latch 76 connects to a disable input of counter 79. The clock input signal at terminal 53 connects to a clock input of counter 79, and data output bus 80 of counter 79 connects to data input 36 of computer 37 (see FIG. 1).

Multiplexer 54 allows the first phase difference sample ($\phi 1$) to occur at either the receipt of a signal from pulse shaper 44 or from processor 38 control. Processor 38 controls which of these two modes is selected by causing an appropriate level to appear at second output 58 of data latch 56. In the pulse shaper selection mode, a timing pulse from pulse shaper 44 indicating that a pulse of information has been received, enters multiplexer 54, passes through to delay line 66 and causes a first pulse to appear at strobe 74 through AND gate 68. Many circuits are known in the art to accomplish this pulse indication function of pulse shaper 44 and may include the use of capacitor-diode combinations, or multivibrator circuits. The processor control mode causes a first pulse to appear at strobe output 74 from the occurence of a control signal at first output 57 which is routed through multiplexer 54, delay line 66, and AND gate 68.

A fast time interval ($\Delta t$) mode is also controlled by processor 38 through the setting of an appropriate level at third output 60 from the data latch 56. This mode is enabled by setting a high level at third output 60 to enable AND gate 70 and by causing the carry output of counter 75 to be at a low level. When AND gate 70 is thus enabled, a second pulse appears at strobe output 74 after a time interval from the first pulse represented by the delay of delay line 66. Delay line 66 allows fast and accurate time intervals, and processor 38 can determine the time interval from a stored constant in memory 39.

Longer time interval modes are also controlled by processor 38. For example, if the incoming signal is pulse modulated, the time between successive pulses may determine the time interval. This mode occurs by disabling the fast interval mode described above, and allowing the first pulse to occur twice when two successive pulses occur. In this case processor 38 can obtain the time interval between first and second phase difference samples from output 80 presented by counter 79. Here, counter 79 starts counting clock pulses received at terminal 53 after the first pulse sets latch 76 to allow counter 79 to count.

Still longer time periods are achieved by not counting successive pulses. This mode is also controllable by processor 38 through loading an appropriate value into counter 75 from fourth output 61 and fifth output bus 62. Counter 75 determines the number of incoming signal pulses to skip between the first and second phase difference samples. Again, processor 38 can obtain the time interval between first and second phase difference samples from output 80.

When the incoming signal is not pulse modulated, longer timing modes are controlled and measured by having processor 38 simulate incoming pulses through multiplexer 54. The time interval information in these non-pulse modulated modes may also be obtained from output 80 of counter 79.

After the phase difference change ($\Delta\phi$) and time interval ($\Delta t$) are determined, processor 38 executes a step 216 (see FIG. 3) which computes the instantaneous frequency (Fi) calculation according to equation (1) mentioned above. A step 218 then determines an error frequency (Fe) by subtracting the instantaneous frequency (Fi) from the frequency of the fixed frequency oscillator 24. The processor obtains the fixed frequency oscillator's frequency from a stored constant in memory 39.

Figure 5:
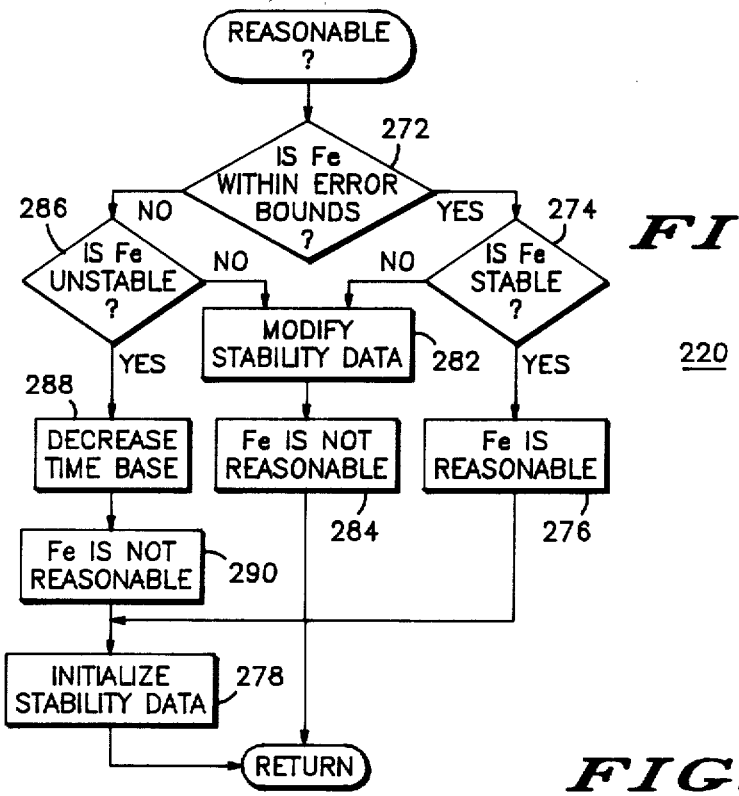
FIG. 5 expands the step which determines whether an error frequency is reasonable from the flow chart shown in FIG. 3.

In a step 220 processor 38 determines whether the error frequency from step 281 represents a reasonable error frequency, FIG. 5 expands the step 220 into several substeps. Referring to FIG. 5, step 272 resolves whether the error frequency (Fe) is within expected bounds. As processor 38 repeats the sequences of steps described herein, it builds information about the frequency of the incoming signal. Accordingly, step 272 expects the error frequency (Fe) to be within some bounds determined by past calculations of error frequency (Fe).

If step 272 determines that the error frequency is within expected bounds, then a step 274 inquires whether the error frequency (Fe) is stable. Fe would be considered stable only if it has previously been calculated a predetermined number of times. Thus, steps 272 and 274 work together to insure that noise and ambiguity effects are discounted before processor 38 uses the error frequency (Fe) to change the local oscillation signal output from variable frequency oscillator 18 (see FIG. 1). If step 274 determines that Fe is stable then a step 276 indicates that Fe is in fact reasonable, and a step 278 initializes stability data for future reasonableness determinations.

Error frequency (Fe) may be unreasonable for any of several reasons. If step 272 determines that Fe is not within expected bounds, then a step 286 is executed which inquires whether Fe is unstable. Stability data built up from previous Fe calculations aid this inquiry. If Fe is not unstable, then a step 282 modifies stability data to reflect the present Fe calculation, and a step 284 indicates that Fe is not reasonable. Likewise, if step 274 mentioned above determines that Fe is not yet stable, then step 282 is executed to appropriately modify stability data and step 284 indicates that Fe is not reasonable.

If step 286 indicates that error frequency (Fe) is in fact unstable, then ambiguous phase difference changes ($\Delta\phi$) are possibly being calculated. Accordingly, a step 288 causes the processor to decrease the controllable time interval ($\Delta t$) so that future Fe calculations might yield reasonable results. A step 290 declares that Fe is not reasonable and step 278 again initializes stability data for future calculations.

If step 220 from FIG. 3 indicates that error frequency (Fe) is not reasonable, then step 236 ignores the first and second phase difference samples and phase values determined therefrom and causes program execution to repeat at reset capture sequence step 204.

If step 220 indicates that error frequency (Fe) is reasonable, then a step 222 determines a control value which will appropriately vary the local oscillator frequency output from variable frequency oscillator 18.

After the appropriate control value has been determined, step 224 then causes this value to appear at data output 40 which will in turn cause the local oscillator frequency to change.

Next, a step 226 inquires whether the error frequency (Fe) is within a lock tolerance. The lock tolerance represents a maximum degree of accuracy that can be achieved with a given time interval. Accordingly, when Fe is within lock tolerance the variable frequency oscillator is locked to the frequency of the incoming signal at terminal 10 and no substantial improvement in the precision with which the local oscillator signal is locked to the incoming signal can be expected. If step 226 determines that lock tolerance is not yet achieved, program execution is routed to reset capture sequence step 204.

If step 226 determines that lock tolerance has been achieved, then a step 228 inquires whether the final desired accuracy has been achieved. Since it takes time to continue to resolve the frequency of the incoming signal more precisely, processor 38 may advantageously perform other tasks when some predetermined level of accuracy has been reached. Accordingly, when this situation occurs the process has finished and the program execution exits at step 230.

If step 228 determines that the final desired accuracy has not yet occurred, then a step 232 causes the time interval to increase as described above and a new lock tolerance is calculated in a step 234. Finally, after the new lock tolerance has been calculated program execution repeats at reset capture sequence step 204.

Figure 7:
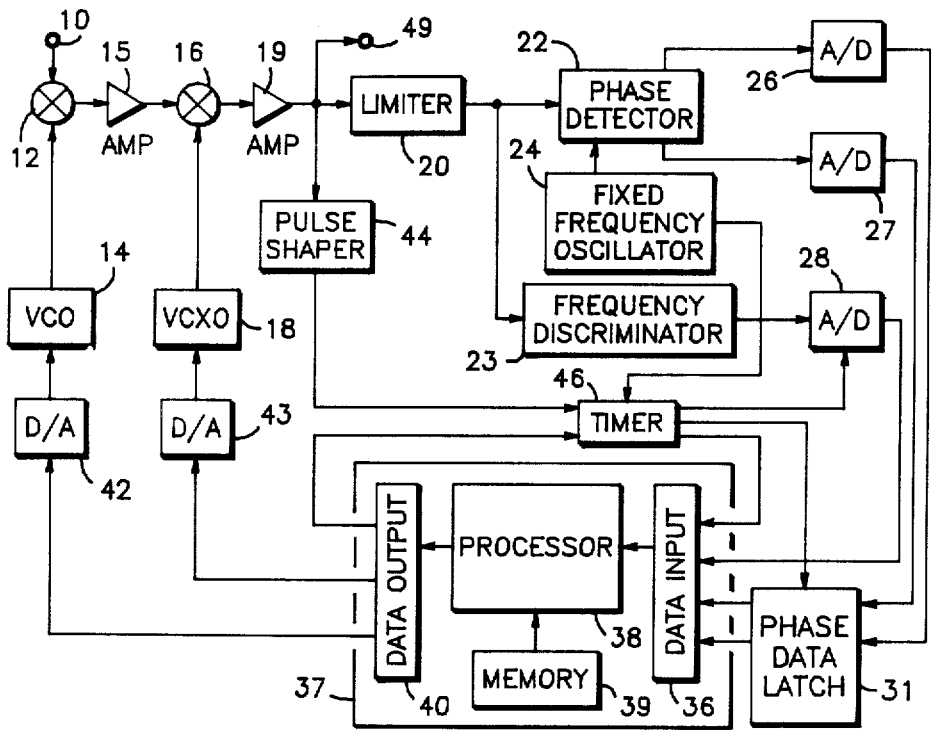
FIG. 7 shows a second embodiment of the present invention.

FIG. 7 shows a more detailed block diagram of an embodiment of the present invention than is shown in the FIG. 1 block diagram. Like items of FIGS. 1 and 7 are referenced by the same number.

In the FIG. 7 embodiment an incoming signal having an unknown frequency is applied at terminal 10. A mixer 12 receives this incoming signal along with a signal from a variable frequency oscillator, such as voltage controlled oscillator (VCO) 14. An output of mixer 12 produces a resulting signal that feeds an amplifier 15. The resulting signal and the local oscillator signal from variable frequency oscillator 18 enter mixer 16. In this embodient variable frequency oscillator 18 is a crystal controlled VCO which tends to be significantly more stable and accurate than VCO 14. The intermediate signal output from mixer 16 feeds an amplifier 19. Thus, the configuration of mixers 12 and 16, amplifiers 15 and 19, and oscillators 14 and 18 resemble a superhetrodyne type receiver. Furthermore, mixers 12 and 16 may be balanced modulators to produce a double-sideband suppressed-carrier output, and amplifiers 15 and 19 may incorporate other bandpass filtering known to those skilled in the art.

The intermediate signal output from amplifier 19 connects to a limiter 20 and pulse shaper 44. This intermediate signal may also be routed to a terminal 49 for input to other circuits which extract amplitude modulation information from the incoming signal. As discussed above pulse shaper 44 provides timing signals to timer 46. Limiter 20 conditions the amplitude of the intermediate signal before the signal is presented to a frequency discriminator 23 and phase detector 22.

Fixed frequency oscillator 24 represents a crystal controlled oscillator which in this embodiments outputs an oscillating signal to phase detector 22 and timer 46, both of which have been discussed above. The two outputs from phase detector 22 described above connect to analog-to-digital (A/D) converter 26 and to an A/D converter 27. Likewise an output from frequency discriminator 23 connects to an A/D converter 28. Frequency discriminator 23 represents any of several types of frequency discriminators known to those skilled in the art that convert an instantaneous frequency input into an analog signal output. In this specific embodiment, A/D converters 26, 27, and 28 each represent eight bit "flash" type converters whose outputs constantly reflect the digital representation of their analog input but may be associated with digital data latches for saving the digital representation of analog data. Thus, outputs of A/D converters 26 and 27 couple to data inputs of a phase data latch 31, and data outputs of phase data latch 31 coupled to data input 36 of computer 37.

The outputs from A/D converters 26, 27, and 28 each couple to data input 36 of computer 37. A strobe output of timer 46 couples to a control input of phase data latch 31, and another output from timer 46 also couples to the data input 36. Data input 36 supplies information to processor 38 which executes a computer program contained in memory 39. Processor 38 supplies output to data output 40, which in turn connects to timer 46 and digital-to-analog (D/A) converters 42 and 43.

D/A converters 42 and 43 convert the digital data supplied by processor 38 into analog voltages and currents. The analog output from D/A converter 42 connects to a control input of VCO 14 while the analog output from D/A converter 43 connects to a control input of variable frequency oscillator 18.

The embodiment of FIG. 7 achieves a similar automatic frequency control as described above in conjunction with FIG. 1. However, the FIG. 7 embodiment contains two frequency resolution loops instead of the single frequency resolution loop of the FIG. 1 embodiment. Processor 38 uses the outside loop to make coarse frequency adjustments. The coarse or outside loop includes mixer 12, amplifier 15, mixer 16, amplifier 19, limiter 20, frequency discriminator 23, A/D converter 28, computer 37, D/A converter 42 and VCO 14. Accordingly, frequency information from frequency discriminator 23 dictates the coarse frequency control values which are output to VCO 14. Thus, a coarse adjustment on frequency is accomplished through this outer loop by computer 37 computing a coarse error frequency value based on an existing VCO 14 frequency and the instantaneous coarse frequency information from frequency discriminator 23.

When the outer loop has resolved the frequency to the best of its ability, the resulting signal presented at the output of amplifier 15 is within a narrow range of frequencies. This permits the frequency of the incoming signal at terminal 10 to vary within a relatively large range of frequencies without causing the ambiguity problems desribed above. This outer loop can typically resolve the frequency of the incoming signal to an accuracy of 1 part in 10,000. The use of two loops also allows the intermediate frequency to be high enough to allow an accurate determination of phase difference changes in a short interval of time, but remain low enough in frequency to permit processing by standard components. In the present embodiment this intermediate signal is confined to a range of approximately 0.5 MHz centered around 60 MHz.

The computer program utilizes the outer loop to resolve the frequency of the incoming signal to within a first lock tolerance which is determined by the characteristics of the outer loop. Then without changing the data at the control input of VCO 14, the computer program performs the steps mentioned above in connection with FIGS. 3–5. The computer program used with this embodiment may also include a step which inquires whether it is necessary to manipulate the outer loop when it appears that reasonable error frequency (Fe) calculations are not achievable at a given time interval setting.

Although specific embodiments and specific computer program steps have been described herein to aid the teaching of the present invention, those skilled in the art will recognize than many modifications in the above mentioned embodiments are within the scope of the present invention. For example, the sequencing of steps and the precise methods of verifying the data described above may be altered in any number of ways. The specific circuits used to implement each of the blocks in the FIG. 1 and FIG. 7 embodiments of the present invention are suspectible to many variations in different applications having different accuracy, locking speed, and incoming signal characteristics. For example, phase detector 22 need not be a quadrature phase detector for applications requiring even more phase difference signal accuracy or permitting more time to achieve a final lock condition. Specific timing circuits have been presented for teaching purposes, but those skilled in the art will recognize that many variations of timers which are controlled by computer output or other external signals are still within the scope of the present invention. Also, no particular processor is required to implement the present invention. The present invention utilizes a Motorola 68000 microprocessor for this function, but those skilled in the art of real-time computer applications will recognize that many processors and computer architectures are within the scope of the present invention.

What is claimed is:

1. An automatic frequency control circuit comprising:
   a mixer having first and second inputs and an output, the first input of said mixer for receiving an input signal;
   a variable frequency oscillator having a control input and an oscillation output, the oscillation output of said variable frequency oscillator being coupled to the second input of said mixer;
   a phase detector having signal and reference inputs and having an output fir indicating the instantaneous phase difference between signals presented at the signal and reference inputs of said phase detector, the signal input of said phase detector being coupled to the ouput of said mixer;
   a fixed frequency oscillator having an oscillation output coupled to the reference input of said phase detector; and
   a computer having memory containing a predetermined program and having a data input and a data output, the data input being coupled to the output of said phase detector, and the data output being coupled to the control input of said variable frequency oscillator.

2. An automatic frequency control circuit as claimed in claim 1 wherein said variable frequency oscillator is a crystal controlled oscillator.

3. An automatic frequency control circuit as claimed in claim 1 wherein:
   said phase detector is a quadrature phase detector; and
   said phase detector additionally comprises a second output, and the second output of said phase detector coupled to the data input of said computer.

4. An automatic frequency control circuit as claimed in claim 1 wherein said fixed frequency oscillator is a crystal oscillator.

5. An automatic frequency control circuit as claimed in claim 1 additionally comprising:
   a timer having control input, a strobe output, and a data output, the timer control input being coupled to the data output of said computer and the data output being coupled to the data input of said computer; and
   a phase data latch having control and data inputs and a data output, said phase data latch being coupled between the output of said phase detector and the data input of said computer so that the data input of said phase data latch couples to the output of said phase detector and the data output of said phase data latch couples to the data input of said computer, and the control input of said phase data latch being coupled to the strobe output of said timer.

6. An automatic frequency control circuit comprising:
   a terminal for receiving an input signal;

a first mixer having first and second inputs and an output;

first means for coupling the first input of said first mixer to said terminal;

a variable frequency oscillator having a control input and an oscillation output;

means for coupling the oscillation output of said variable frequency oscillator to the second input of said first mixer;

a phase detector having signal and reference inputs and having an output for indicating the instantaneous phase difference between signals presented at the signal and reference inputs of said phase detector;

second means for coupling the output of said first mixer to the signal input of said phase detector;

a fixed frequency oscillator having an oscillation output;

means for coupling the oscillation output of said fixed frequency oscillator to the reference input of said phase detector;

a computer having memory containing a predetermined program and having a data input and data output;

third means for coupling the output of said phase detector to the data input of said computer; and means for coupling the data output of said computer to the control input of said variable frequency oscillator.

7. An automatic frequency control circuit as claimed in claim 6 wherein said first means for coupling comprises:

a second mixer having first and second inputs and an output, said second mixer being coupled to said first mixer so that the output of said second mixer couples to the first input of said first mixer, and the first input of said second mixer being coupled to said terminal; and a second variable frequency oscillator having a control input and an oscillation output, the oscillation output of said second oscillator being coupled to the second input of said second mixer, and the control input of said second oscillator being coupled to the data output of said computer.

8. An automatic frequency control circuit as claimed in claim 6 wherein said second means for coupling comprises a limiter having an input and an output, the input of said limiter being coupled to the output of said first mixer, and the output of said limiter being coupled to the signal input of said phase detector.

9. An automatic frequency control circuit as claimed in claim 6 wherein said third means for coupling comprises a phase data latch having control and data inputs and a data output, the data output of said phase data latch being coupled to the data input of said computer, and wherein the automatic frequency control circuit additionally comprises:

a timer having a control input, a strobe output, and a data output, the control input of said timer being coupled to the output of said first mixer, the date output of said timer being coupled to the data input of said computer, and the strobe output of said timer being coupled to the control input of said phase data latch; and fourth means for coupling the data input of said phase data latch to the output of said phase detector.

10. An automatic frequency control circuit as claimed in claim 9 wherein said fourth means for coupling comprises an analog-to-digital converter having an analog input and a digital output, the analog input of said converter being coupled to the output of said phase detector, and the digital output of said converter being coupled to the data input of said phase data latch.

11. An automatic frequency control circuit as claimed in claim 6 additionally comprising a frequency discriminator having an input and an output, the input of said discriminator being coupled to the signal input of said phase detector and the output of said discriminator being coupled to the data input of said computer.

12. A method for detecting the frequency of an input signal having an unknown frequency, said method comprising the steps of:

mixing the input signal with a variable frequency oscillating signal to produce an intermediate signal;

resolving a first instantaneous phase difference between the intermediate signal and a fixed frequency oscillating signal to produce a first phase value bearing a predetermined relationship to the phase difference;

resolving a second instantaneous phase difference between the intermediate signal and the fixed frequency oscillating signal to produce a second phase value, said second phase difference being resolved a controllable time interval after the revolution of the first phase difference;

computing an instantaneous frequency calculation based on the difference between the second and first phase values and on the time interval;

varying the frequency of the variable frequency oscillating signal in accordance with the instantaneous frequency calculation so that the variable frequency oscillating signal operates as negative feedback in said mixing step and tends to cause the instantaneous frequency calculation of said computing step to seek a DC level; and repeating said resolving steps and said computing and varying steps until the instantaneous frequency calculation of said computing step is within a lock tolerance.

13. A method as claimed in claim 12 additionally comprising before said resolving steps, the steps of:

discriminating the frequency of the intermediate signal to produce a coarse frequency value bearing a second predetermined relationship to the frequency of the intermediate signal;

varying the frequency of the variable frequency oscillating signal in accordance with the coarse frequency value of said discriminating step; and repeating said discriminating and varying in accordance with coarse frequency value steps until an instantaneous coarse frequency is within a predetermined coarse frequency lock tolerance.

14. A method as claimed in claim 13 wherein:

said mixing step comprises the steps of combining the input signal with a second adjustable variable frequency oscillating signal to produce a resultant signal, and combining the resultant signal with the variable frequency oscillating signal to produce the intermediate signal; and said varying in accordance with the coarse frequency step adjusts the frequency of the second variable frequency oscillating signal and said varying in accordance with the frequency error calculation step controls the variable frequency oscillating signal.

15. A method as claimed in claim 12 wherein said computing step further comprises the steps of:
   distinguishing between valid and invalid first and second phase values; and
   ignoring invalid phase values.

16. A method as claimed in claim 15 wherein:
   said resolving steps each further comprise the step of generating first and second orthogonal phase signals so that the first and second phase signals suggest the phase values; and
   said distinguishing step further includes the step of defining invalid phase values as being suggested by phase signals substantially representing integral multiples of 45 degree phase difference from the fixed frequency oscillation signal.

17. A method as claimed in claim 12 additionally comprising after the repeating steps, the steps of:
   increasing the time of the controllable time interval;
   calculating a new lock tolerance; and
   performing said resolving steps, and said computing, varying, and repeating steps.

18. A frequency resolution apparatus for determining the frequency of an incoming signal having an unknown frequency, said apparatus comprising:
   a first mixer having first and second inputs and an output, the first input of said first mixer being for receiving the incoming signal;
   a second mixer having first and second inputs and an output, the first input of said second mixer being coupled to the output of said first mixer;
   a limiter having an input coupled to the output of said second mixer and an having an output, said limiter for conditioning the amplitude of an intermediate signal produced by said second mixer;
   a frequency discriminator for converting the frequency of the intermediate signal into an analog voltage, said frequency discriminator having an input coupled to the output of said limiter and having an output;
   a crystal controlled fixed frequency oscillator having an output;
   a quadrature phase detector having a signal and a reference input and having first and second orthogonal outputs, the output of said fixed frequency oscillator being coupled to the reference input, the output of said limiter being coupled to the signal input, and the outputs of said phase detector supplying signals bearing a predetermined relationship to the instantaneous phase difference between signals presented to the signal and reference inputs of said phase detector;
   a computer having a memory containing a predetermined program and having a data input and a data output, the data input being coupled to the first and second outputs of said phase detector;
   a first voltage controlled oscillator having a control input and an output, the output of said first oscillator being coupled to the second input of said first mixer and the control input of said first oscillator being coupled to the data output of said computer; and
   a second voltage controlled oscillator having a control input and an output, the output of said second oscillator being coupled to the second input of said second mixer and the control input of said second oscillator being coupled to the data output of said computer, said second oscillator being crystal controlled.

19. An automatic frequency control circuit comprising:
   a mixer having first and second inputs and an output, the first input of said mixer for receiving an input signal;
   a variable frequency oscillator having a control input and an oscillation output, the oscillation output of said variable frequency oscillator being coupled to the second input of said mixer
   a phase detector having signal and reference inputs and having an output for indicating the instantaneous phase difference between signals presented at the signal and reference inputs of said phase detector, the signal input of said phase detector being coupled to the output of said mixer;
   a fixed frequency oscillator having an oscillation output coupled to the reference input of said phase detector; and
   computer means having a data input and a data output, the data input being coupled to the output of said phase detector, and the data output being coupled to the control input of said variable frequency oscillator, said computer means for determining phase values and time intervals and calculating instantaneous frequency from the phase values and time intervals

* * * * *

UNITED STATES PATENT AND TRADEMARK OFFICE
CERTIFICATE OF CORRECTION

PATENT NO.   : 4,715,001
DATED        : December 22, 1987
INVENTOR(S)  : Jake O. Deem; Ronald W. Kassik and N. Bruce Metteer It is certified that error appears in the above-identified patent and that said Letters Patent is hereby corrected as shown below:

Column 12, claim 1, line 23, change "fir" to --for--.

Column 13, claim 9, line 60, change "date" to --data--.

Signed and Sealed this

Fourteenth Day of June, 1988

Attest:

DONALD J. QUIGG

*Attesting Officer*   *Commissioner of Patents and Trademarks*